United States Patent
Hirler et al.

(10) Patent No.: US 8,917,135 B2
(45) Date of Patent: Dec. 23, 2014

(54) CIRCUIT WITH A PLURALITY OF DIODES AND METHOD FOR CONTROLLING SUCH A CIRCUIT

(71) Applicant: Infineon Technologies Austria AG, Villach (AT)

(72) Inventors: Franz Hirler, Isen (DE); Anton Mauder, Kolbermoor (DE); Frank Pfirsch, München (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/893,430

(22) Filed: May 14, 2013

(65) Prior Publication Data

US 2014/0340139 A1  Nov. 20, 2014

(51) Int. Cl.
  *H03K 17/74* (2006.01)
(52) U.S. Cl.
  CPC ..................................... *H03K 17/74* (2013.01)
  USPC ............ 327/504; 327/309; 327/384; 327/379
(58) Field of Classification Search
  USPC ......... 327/493–505, 310, 384, 551, 306–309, 327/311–333, 108–112, 427, 379, 434, 437, 327/374–377
  See application file for complete search history.

(56) References Cited

U.S. PATENT DOCUMENTS

| | | | |
|---|---|---|---|
| 4,242,624 A * | 12/1980 | Schalk et al. | 318/696 |
| 5,343,098 A * | 8/1994 | Miyasaka | 327/310 |
| 6,046,915 A * | 4/2000 | Jacobs et al. | 363/39 |
| 7,180,349 B2 | 2/2007 | Leifso et al. | |
| 7,285,992 B1 | 10/2007 | Maida | |
| 7,804,337 B2 | 9/2010 | Payne et al. | |
| 8,368,432 B2 | 2/2013 | Butselaar et al. | |
| 8,619,382 B2 | 12/2013 | Kuehlwein | |
| 8,710,875 B2 | 4/2014 | Bai et al. | |
| 8,779,807 B2 | 7/2014 | Liang | |
| 2004/0056702 A1 * | 3/2004 | Nagasu et al. | 327/504 |
| 2005/0184952 A1 * | 8/2005 | Konno et al. | 345/102 |
| 2008/0007883 A1 * | 1/2008 | Arndt et al. | 361/56 |
| 2009/0080465 A1 | 3/2009 | Yang et al. | |
| 2009/0219060 A1 | 9/2009 | Payne et al. | |
| 2009/0284303 A1 | 11/2009 | Hu et al. | |
| 2010/0271081 A1 | 10/2010 | Caiafa et al. | |
| 2011/0089865 A1 | 4/2011 | Wang et al. | |
| 2011/0121812 A1 | 5/2011 | Salvestrini | |
| 2011/0140763 A1 | 6/2011 | Noh et al. | |
| 2012/0032725 A1 * | 2/2012 | Hiyama | 327/382 |
| 2012/0043906 A1 | 2/2012 | Jones | |
| 2012/0249191 A1 | 10/2012 | Marie et al. | |
| 2012/0293214 A1 | 11/2012 | Blom | |
| 2012/0293219 A1 | 11/2012 | Bai et al. | |
| 2012/0313669 A1 | 12/2012 | Pan et al. | |
| 2013/0049816 A1 | 2/2013 | Cioci | |

(Continued)

*Primary Examiner* — Lincoln Donovan
*Assistant Examiner* — Thomas Skibinski
(74) *Attorney, Agent, or Firm* — Murphy, Bilak & Homiller, PLLC

(57) ABSTRACT

A circuit includes a diode circuit and a deactivation circuit. The diode circuit includes a first terminal, a second terminal, and a plurality of diodes coupled in parallel between the first terminal and the second terminal. The diode circuit is configured to be forward biased in an on-time and reverse biased in an off-time. The deactivation circuit is configured to switch a first group of the diodes into a deactivation state at a time instant before the end of the on-time, the first group of diodes including one or more but less than all of the diodes included in the diode circuit.

27 Claims, 5 Drawing Sheets

(56) References Cited

U.S. PATENT DOCUMENTS

| | | |
|---|---|---|
| 2013/0285471 A1 | 10/2013 | Ren et al. |
| 2013/0285703 A1 | 10/2013 | McGinn |
| 2013/0301326 A1 | 11/2013 | Zoels et al. |
| 2013/0314146 A1 | 11/2013 | Lin |
| 2014/0002137 A1 | 1/2014 | Friedman et al. |
| 2014/0035627 A1 | 2/2014 | Dunipace |
| 2014/0055170 A1 | 2/2014 | Liang |
| 2014/0139941 A1 | 5/2014 | Kuehlwein |

* cited by examiner

CIRCUIT WITH A PLURALITY OF DIODES AND METHOD FOR CONTROLLING SUCH A CIRCUIT

TECHNICAL FIELD

Embodiments of the present disclosure relate to a circuit with a plurality of diodes and to a method for controlling such a circuit.

BACKGROUND

Bipolar diodes are widely used in different circuit applications in the automotive and industrial field. For example, in switching applications in which an electronic switch cyclically switches on and off an inductive load, a diode can be employed as a free-wheeling diode that takes over a current induced in the inductive load after the switch has been switched off.

In operation of a diode, conduction losses occur. These conduction losses are dependent on the voltage across the diode (often referred to as forward voltage $V_F$) and the current through the diode.

Further, electrical charge (often referred to as reverse recovery charge $Q_{RR}$) resulting from a charge carrier plasma with n-type and p-type charge carriers is stored in the diode when the diode is forward biased and conducting a current. When an operation state of the diode changes from a forward biased state to a reverse biased state, the reverse recovery charges have to be removed from the diode before the diode is capable to block the voltage that reverse biases the diode. This process is often referred to as reverse recovery process. During the reverse recovery process, the charges stored in the diode cause a reverse current (often referred to as $I_{RR}$). This reverse current resulting from charge stored in the diode multiplied by the voltage across the diode during the reverse recovery process equals the lower limit of the power losses resulting from the reverse recovery process. The time integral of these losses equals the energy that is dissipated each time the diode changes from the forward biased state to the reverse biased state.

In general, at a given current rating and a given voltage blocking capability, diodes with a low forward voltage (and low conduction losses) have a higher reverse recovery charge, and vice versa. Usually, the current rating of a diode is chosen in accordance with the highest currents occurring in an application in which the diode is implemented. A diode with a high current rating has a large chip size and has a high reverse recovery charge. When the diode operates at currents below the current rating, the diode is over-dimensioned so that at low currents relatively high losses resulting from the reverse recovery charge $Q_{RR}$ occur.

It is therefore desirable to reduce diode losses in circuit applications.

SUMMARY

A first aspect relates to a method for operating a circuit. The circuit includes a first terminal and a second terminal and a plurality of diodes coupled in parallel between the first terminal and the second terminal. The method includes in one drive cycle applying a first voltage between the first terminal and the second terminal for an on-time, wherein the first voltage is configured to forward bias the diodes, applying a second voltage between the first terminal and the second terminal for an off-time after the on-time, wherein the second voltage is configured to reverse bias the diodes, and switching a first group of diodes, but less than the plurality of diodes, into a deactivation state at a time instant before the end of the on-time.

A second aspect relates to a circuit. The circuit includes a diode circuit with a first terminal and a second terminal, and with a plurality of diodes coupled in parallel between the first terminal and the second terminal. The diode circuit is configured to be forward biased in an on-time and reverse biased in an off-time. The circuit further includes a deactivation circuit configured to switch a first group of diodes, but less than the plurality of diodes, from an activation state to a deactivation state at a time instant before the end of the on-time.

A third aspect relates to a method for operating a circuit. The circuit includes a first terminal, a second terminal and a plurality of diodes coupled in parallel between the first terminal and the second terminal. The method comprises in one drive cycle: applying a first voltage between the first terminal and the second terminal for an on-time, wherein the first voltage is configured to forward bias the diodes; applying a second voltage between the first terminal and the second terminal for an off-time after the on-time, wherein the second voltage is configured to reverse bias the diodes; and keeping in a deactivation state a first group of the diodes during the on-time, the first group of diodes comprising one or more but less than all of the diodes included in the circuit.

Those skilled in the art will recognize additional features and advantages upon reading the following detailed description and on viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following detailed description, reference is made to the accompanying drawings, which form a part thereof, and in which are shown by way of illustration specific embodiments in which the invention may be practiced.

Figure 1:
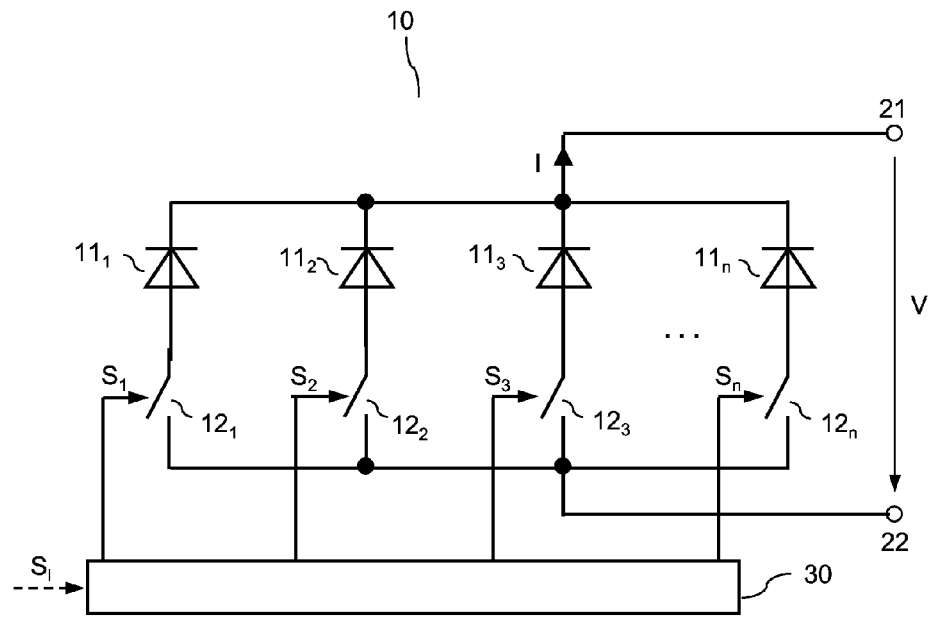
FIG. 1 illustrates a first embodiment of a diode circuit including a plurality of diodes.

FIG. 1 illustrates a first embodiment of a circuit 10 that will be referred to as diode circuit in the following. The diode circuit 10 includes a plurality of n, with n≥2, diodes $11_1$-$11_n$ coupled in parallel between a first terminal 21 and a second terminal 22. In FIG. 1, n=4 diodes are shown. However, this is only an example. The overall number of diodes $11_1$-$11_n$ may vary dependent on the specific application where the diode circuit 10 is employed. In the present embodiment, the diodes $11_1$-$11_n$ have their cathode coupled to the first terminal 21 and have their anode coupled to the second terminal 22. The terminals 21, 22 of the circuit 10 may, for example, be coupled to the terminals of a load (not shown).

The terminals 21, 22 are configured to receive a voltage V. This voltage V can have one of a first polarity and a second polarity. The first polarity forward biases the diodes $11_1$-$11_n$, while the second polarity reverse biases the diodes $11_1$-$11_n$. A voltage level of the voltage V with the first polarity will also be referred to as first voltage level V1 and a voltage level with the second polarity will also be referred to as second voltage level V2 in the following.

In the embodiment of FIG. 1, the individual diodes $11_1$-$11_n$ can be activated and deactivated independent of each other. For this, a respective switch $12_1$, $12_2$, $12_3$, $12_n$ is connected in series with each of the diodes $11_1$-$11_n$. A drive circuit 30 is configured to output drive signals $S_1, S_2, S_3, S_n$ that switch the individual switches $12_1$-$12_n$ on and off. The operating principle of the drive circuit 30 is explained below. Each of the plurality of diodes $11_1$-$11_n$ is activated when the corresponding switch $12_1$-$12_n$ connected in series therewith is switched on (in an on-state) and is deactived when the corresponding switch $12_1$-$12_n$ connected in series therewith is switched off (in an off-state).

The individual diodes $11_1$-$11_n$ can be integrated in one common semiconductor chip, or can be integrated in two or more separate semiconductor chips. It is even possible to integrate each of the diodes $11_1$-$11_n$ in a separate semiconductor chip.

The possibility to activate and deactivate each of the plurality of diodes $11_1$-$11_n$ and to activate and deactivate the diodes $11_1$-$11_n$ independently is only an example. According to a further embodiment at least one of the diodes $11_1$-$11_n$ is always activated. And according to yet another embodiment at least two of the diodes $11_1$-$11_n$ are activated and deactivated together. An embodiment of a diode circuit 10 in which both of these options are implemented is illustrated in FIG. 2.

Figure 2:
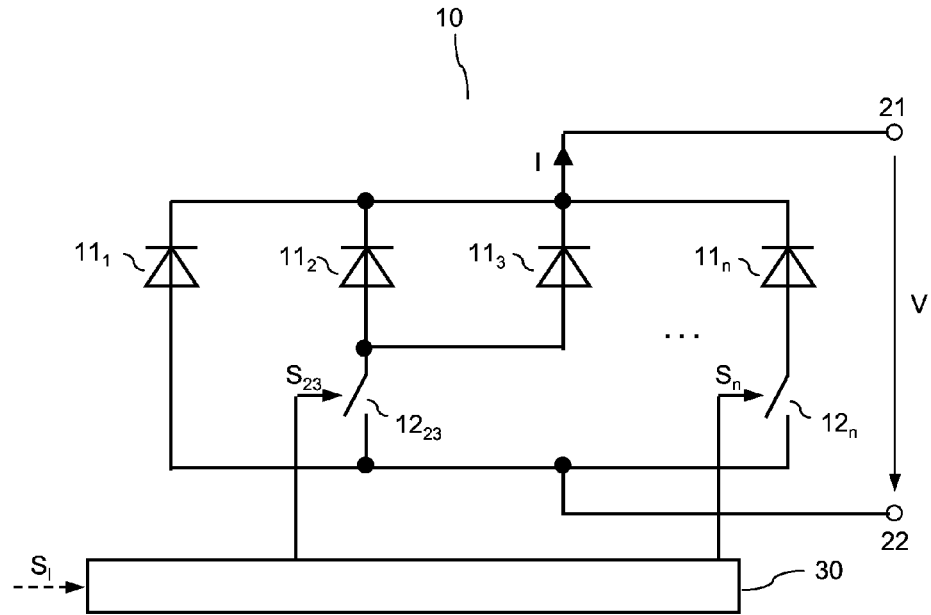
FIG. 2 illustrates a modification of the diode circuit of FIG. 1.

In the diode circuit 10 of FIG. 2, a first diode $11_1$ is permanently activated. That is, the first diode $11_1$ has its cathode directly connected to the first terminal 21 and its anode directly connected to the second terminal 22 so that there is no switch between the first diode $11_1$ and one of the terminals 21, 22. A second diode $11_2$ and a third diode $11_3$ are connected to the terminals 21, 21 via a common switch $12_{23}$ that activates or deactivates both of the second and third diodes $11_2$, $11_3$.

The operating principle of the diode circuits 10 of FIGS. 1 and 2 is explained below. For explanation purposes it is first assumed that each of the diodes $11_1$-$11_n$ is activated. That is, each of the diodes $11_1$-$11_n$ is capable of conducting a current when the first voltage level V1 is applied to the terminals 21, 22. Just for explanation purposes it is further assumed that the individual diodes $11_1$-$11_n$ have the same chip size, so that they have the same current rating.

When the diodes $11_1$-$11_n$ are forward biased, conduction losses occur. At a given load current I through the parallel circuit with the diodes $11_1$-$11_n$ these conduction losses can be decreased by increasing the number of diodes $11_1$-$11_n$ of the diode circuit 10, that is, by increasing the overall chip size. The overall chip size is the sum of the chip sizes of the individual diodes $11_1$-$11_n$.

However, an increase of the chip size may result in an increase of switching losses (commutation losses). Switching losses occur in each of the diodes $11_1$-$11_n$, when an operation state of the corresponding diode $11_1$-$11_n$ changes from a forward biased state to a reverse biased, that is when the voltage V changes from the first voltage level V1 to the second voltage level V2. This is explained with reference to the ith diode $11_i$ of the plurality of diodes in the following. When the ith diode $11_i$ is forward biased and conducts a portion of the current I, a charge carrier plasma including electrons and holes is present in semiconductor regions of the ith diode $11_i$.

When the ith diode $11_i$ is reverse biased, the electrical charge (reverse recovery charge) resulting from this plasma is removed from the ith diode $11_i$. The removal of the charge carrier plasma causes a reverse recovery current (often referred to as $I_{RR}$) to flow from the ith diode $11_i$. Losses that occur in the diode connection with the reverse recovery process are defined by the reverse recovery current multiplied by the voltage across the ith diode $11_i$ during the reverse recovery process. These losses increase towards the end of the reverse recovery process, when the reverse recovery current is still high and when the voltage across the ith diode $11_i$ has already increased. The time integral of these losses equals the energy that is dissipated in the ith diode $11_i$ each switching process. The reverse recovery charge stored in each of the diodes $11_1$-$11_n$ is dependent on the chip size of each diode and increases as the chip size increases.

In the diode circuits 10 of FIGS. 1 and 2, the overall losses which include conduction losses and switching losses can be minimized by suitably activating and deactivating individual ones of the diodes $11_1$-$11_n$ during the switching process. A switching process includes two subsequent time periods, namely an on-time when the voltage V has the first voltage level V1 and when it is desired for at least one of the diodes $11_1$-$11_n$ to conduct a current, and an off-time when the voltage V has the second voltage level V2 and when it is desired to have no current flow between the terminals 21, 22. In general, as switching losses occur during transition of the diodes $11_1$-$11_n$ from the forward biased state (on-state) to the reverse biased state (blocking state), some of the plurality of diodes $11_1$-$11_n$ may be activated at the beginning of the on-time and may be deactivated before the transition takes place. However, at least one of the diodes $11_1$-$11_n$ is kept activated.

When one of the diodes $11_1$-$11_n$ is deactivated while at least another one of the plurality of diodes $11_1$-$11_n$ is still activated, the voltage across the deactivated diode(s), at maximum, corresponds to the voltage across the diode that is still forward biased. The charge stored in the deactivated diode decreases, as the current through the diode is zero. Thus, a first amount of switching losses occurring in the diode that is deactivated before a reverse biasing voltage is applied to the terminals 21, 22 is lower than a second amount of switching losses that would occur in this diode if the diode was not deactivated, but instead reverse biased through the voltage V between the terminals 21, 22. The difference between the first amount and the second amount is referred to as gain of the switching losses in the following.

In the diode circuit 10, the voltage across the activated diodes increases when at least one of the diodes is deactivated. This results in an increase of conduction losses in the diode circuit 10 after the deactivation. However, in particular when at least one of the diodes $11_1$-$11_n$ is deactivated a relatively short time before the end of the on-time, this increase of conduction losses is smaller than the gain of switching losses obtained by early deactivating the diode.

In this way, the active chip size may be optimized in terms of conduction losses and switching losses. At the beginning of the on-time, a first number of the diodes $11_1$-$11_n$ is activated. This first number may correspond to the overall number n or may be less than the overall number, but is at least one (1). From this number of diodes at least one diode is deactivated before the end of the on-time. Thus, there are two groups of diodes, namely a first group of diodes that are deactivated before the end of the on-time, and a second group of diodes that are permanently activated during the on-time. The second group may include diodes that cannot be deactivated (e.g., because there is no switch connected in series therewith) or diodes that can be activated and deactivated and that are permanently activated during the on-time.

According to a further embodiment, the diodes of the first group are not activated at all during the on-time. That is, these diodes are kept in the deactivation state during the on-time, while the diodes of the second group are in the activation state during the on-time.

Figure 3:
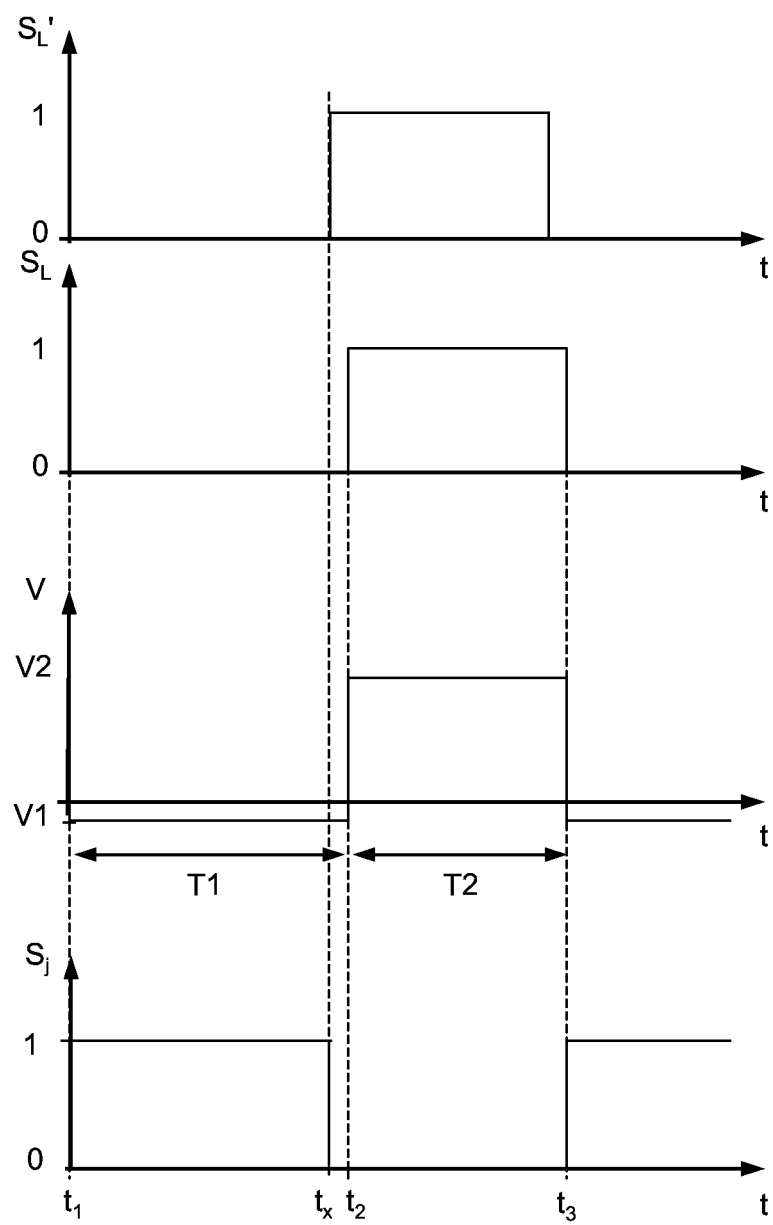
FIG. 3 shows timing diagrams illustrating the operating principle of the circuit according to FIG. 1.

FIG. 3 shows timing diagrams that illustrate the operating principle of the diode circuits 10 of FIGS. 1 and 2. In FIG. 3, the timing diagram of the voltage V applied between the first terminal 21 and the second terminal 22 and the activation state of the diodes of the second group is shown. In FIG. 3, the activation state of the diodes of the first group is represented by one drive signal $S_j$ that activates or deactivates at least one of the diodes of this group. For explanation purposes it is assumed that the corresponding diode is activated when the drive $S_j$ signal has a high level and is deactivated when the drive signal has a low level.

In FIG. 3, T1 denotes the on-time that lasts from a first time instant $t_1$ to a second time instant $t_2$. During the on-time, the voltage V applied between the first terminal 21 and the second terminal 22 has the first voltage level V1 that forward biases those diodes of the plurality of diodes $11_1$-$11_n$ that are activated. T2 denotes the off-time from the second time instant $t_2$ to a third time instant $t_3$. During the off-time the voltage V applied between the first terminal 21 and the second terminal 22 has the second voltage level V2 that reverse biases those diodes of the plurality of diodes $11_1$-$11_n$ that are activated. The voltage V is only schematically illustrated in FIG. 3. In a real circuit, of course, the slopes of the voltage V are not vertical (as illustrated in FIG. 3).

Referring to FIG. 3, the first group of diodes is activated for most of the on-time T1. However, at a time instant $t_x$, just before the end of the on-time T1, the at least one diode of the first group is deactivated (indicated by the drive signal $S_j$ going low at time $t_x$ in FIG. 3), while the at least one diode of the second group is still activated (an activation signal of the diode of the second group is not illustrated in FIG. 3). This at least one diode of the second group may be permanently activated.

According to one embodiment, a time difference between the time $t_x$ when the at least one diode of the first group is deactivated and the time $t_2$ when the diode circuit 10 is reverse biased is between one and five times the carrier lifetime. In particular, this time difference may be between 1 microseconds (μs) and 10 μs.

In the embodiment of FIG. 3, a new operation cycle starts at time $t_3$ when the voltage V again assumes the first level V1 that forward biases the diode circuit 10. At this time, the diodes of the first group and of the second group are again activated. Different from the illustration in FIG. 3, the activation could also take place at an earlier time between t2 and t3.

The selection of the diodes $11_1$-$11_n$ that belong to the first group and to the second group may change with every drive cycle, or may change after several drive cycles. Especially in operation scenarios in which there is at least one diode that is not activated at all, this may help to more equally distribute the losses amongst the diodes $11_1$-$11_n$, because the selection of the at least one diode that is not activated may change from time to time.

In an embodiment in which the diodes of the first group are activated at a time instant during the on-time (so that these diodes of the first group are not kept in the deactivation state during the on-time), the number of diodes that are activated at the beginning of the on-time, that is the sum of the number of diodes of the first group and the number of diodes of the second group, may vary dependent on a load condition of the diode circuit 10. That is, there may be a further group of diodes that are not activated at all during the on-time, wherein the number of diodes of this further group may vary dependent on a load condition of the diode circuit. Let n be the overall number of diodes in the diode circuit, with:

$$n=n1+n2+n3 \qquad (1),$$

where n1 is the number of diodes of the first group, n2 is the number of diodes of the second group and n3 is the number of diodes of the further group. The number of diodes activated at the beginning of the on-time corresponds to n1+n2, where n1 diodes are deactivated before the end of the on-time and n2 diodes are activated throughout the on-time.

According to one embodiment, the load condition is represented by the load current I through the diode circuit 10 in the forward biased state. In this embodiment, the drive circuit 30 receives the current signal $S_I$ representing the load current I and selects the first number dependent on the current signal $S_I$. The drive circuit 30 can be configured to evaluate the current signal $S_I$ in one drive cycle and to adjust the overall number of diodes that are activated in a following drive cycle dependent on the evaluated current signal $S_I$. According to a further embodiment, the drive circuit 30 is configured to adjust the number of activated diodes in one drive cycle. Equivalently, the number of diodes of the first group can be adjusted dependent on the current signal $S_I$, wherein this number may increase as the current I decreases. According to one embodiment, the overall number of diodes that are activated at the beginning of the on-time decreases as the load current I decreases.

According to a further embodiment, all of the diodes $11_1$-$11_n$ are activated at the beginning of the on-time, while the number of the diodes of the first group is variable dependent on the current signal $S_I$.

Each of the first group and the second group represents a chip size which is the sum of the chip sizes of the diodes in the individual group. According to one embodiment, the individual diodes have different chip sizes. In this case, the drive circuit 30 may not only select the number of diodes in the first and second group dependent on the current signal $S_I$, but may select the diodes of the first and second group such that the chip size represented by the first group and of the chip size represented by the second group increases as the load current increases. Equivalently, the chip size represented by the first group may increase as the load decreases, that is, a higher amount of chip size is deactivated before the end of the on-time when the load current decreases.

Figure 4:
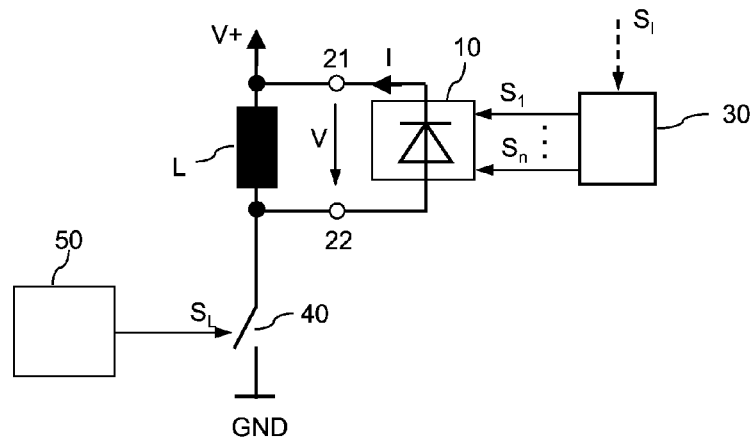
FIG. 4 illustrates an embodiment of an application circuit including a diode circuit of FIG. 1 or 2.

FIG. 4 schematically illustrates an application circuit in which a diode circuit 10 is used as a free-wheeling circuit. The diode circuit 10 is illustrated as a circuit block in FIG. 4, and may be implemented as explained before with reference to FIGS. 1 and 2, or as explained below with reference to FIGS. 5 and 6. Referring to FIG. 4, the application circuit includes a series circuit with an inductive load L and a switching element 40, with the series circuit being connected between a terminal for a positive potential V+ and a terminal for reference potential GND. The diode circuit 10 is connected in parallel with the load L such that the diode circuit 10 is reverse biased when the switching element 40 is switched on. In this case, the voltage between the supply terminals is essentially applied to the load L.

The switching element 40 receives a drive signal $S_L$ that is configured to open or close (switch off or switch on) the switching element 40. When the switching element 40 is closed, the load L is coupled to the terminal for reference potential GND and power is supplied to the load L, so that energy is magnetically stored in the load L. The diode circuit 10 is reverse biased while the switching element 40 is closed. When the switching element 40 is opened, the energy stored in the load L induces a voltage across the load L that forward biases the diode circuit 10 which then conducts a free-wheeling current in order to commutate the load.

The switching element 40 may be opened and closed cyclically. In many applications, for example, a PWM (pulse width modulated) signal $S_L$ (shown in FIG. 2) is provided to the switching element 40, in order to apply a PWM voltage to the load L.

In FIG. 3, a timing diagram of the drive signal $S_L$ is also illustrated. Just for explanation purposes it is assumed that a high level of the drive signal $S_L$ switches on the switching element 40 (so as to reverse bias the diode circuit 10) and a low level of the drive signal $S_L$ switches off the switching element 40 (so as to forward bias the diode circuit 10).

According to one embodiment, a drive circuit 50 that generates the drive signal $S_L$ for the switching element 40 generates a PWM signal $S_L'$ and a time delayed version of this signal $S_L'$, wherein the time delayed signal is the drive signal $S_L$ received by the switching element 40. These two signals $S_L$, $S_L'$ have exactly the same duty cycle. The time delay between these two signals is the desired time delay between the time instant $t_x$ when the diodes of the second group are deactivated and the time $t_2$ when the diode circuit 10 is reverse biased. In this case, the drive circuit 30 may receive the PWM signal $S_L'$ and deactivates the diodes of the second group each time a predefined slope of the PWM signal $S_L'$ (a rising slope in the present embodiment) occurs. This is illustrated in FIG. 3 where the PWM signal $S_L'$ is also shown.

The drive circuit 30 can be configured to detect the beginning of the on-time T1 by evaluating the polarity of the voltage between the terminals 21, 22 or by evaluating the drive signal $S_L$ that drives the switching element 40. Of course, the diodes that are active at the beginning of the on-time can already be activated (e.g., by switching on the corresponding switch $12_1$-$12_n$) during the off-time preceding the on-time.

The diodes $11_1$-$11_n$ of the diode circuit 10 can be integrated in one semiconductor body. The diodes $11_1$-$11_n$ can then be isolated from each other by means of dielectric regions, for example.

Figure 5:
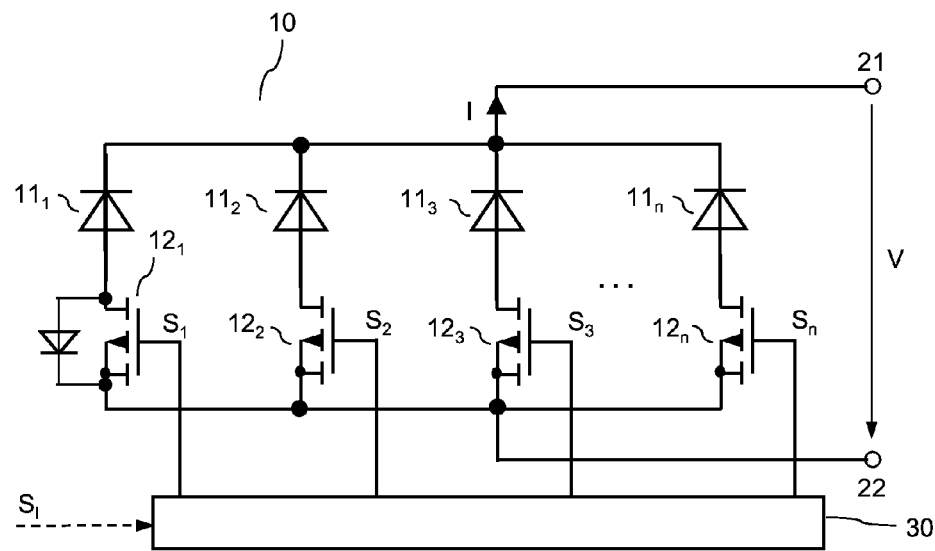
FIG. 5 illustrates a second embodiment of a diode circuit.

Referring to FIG. 5, the switches $12_1$-$12_n$ for activating and deactivating the diodes $11_1$-$11_n$ can be MOS transistors, such as MOSFETs. In the embodiment of FIG. 5, the MOSFETs are p-type MOSFETs. However, any other type of MOSFET or any other type of switching device may be used instead.

The switches $12_1$-$12_n$ can be implemented with a relatively low voltage blocking capability. An arbitrary one of the individual switches $12_1$-$12_n$ blocks when the diode circuit 10 is forward biased and when a corresponding diode $11_1$-$11_n$ is to be deactivated. However, in this case at least one of the other diodes $11_1$-$11_n$ is activated so that the voltage between the terminals 21, 22, which corresponds to the voltage across the blocking switch, is essentially the forward voltage of the at least one forward biased diode. This voltage is about several volts, at most. Switches $12_1$-$12_n$ with a low voltage blocking capability, that may be used in the diode circuit 10, usually have a low on-resistance so that the switches $12_1$-$12_n$ in series with the diodes $11_1$-$11_n$ do not significantly increase the conduction losses of the diode circuit 10. Clamping diodes (not illustrated) such as Zener or Avalanche diodes may be connected in parallel to the switches $12_1$-$12_n$ in order to limit the voltages across the switches $12_1$-$12_n$.

When the diode circuit 10 is reverse biased, the diodes $11_1$-$11_n$ block the reverse biasing voltage and, therefore, protect the switches $12_1$-$12_n$. According to one embodiment, the switches $12_1$-$12_n$ are switched on when the diode circuit 10 is reverse biased. This helps to keep the voltage across the individual switches $12_1$-$12_n$ low and helps to protect the switches $12_1$-$12_n$. When the switches $12_1$-$12_n$ are implemented as MOSFETs that have their internal body diode connected back-to-back with the corresponding diode $11_1$-$11_n$, there is no need to switch on the switches $12_1$-$12_n$ when the diode circuit 10 is reverse biased. In this case, the body diode of each MOSFET clamps the voltage across the MOSFET to the forward voltage of the body diode. Referring to FIG. 5, a p-type MOSFET that has the drain terminal connected to the anode terminal of the corresponding diode (or that has the source terminal connected to the cathode terminal of the corresponding diode) has the internal body diode connected back-to-back with the corresponding diode.

Under certain conditions, a peak current (overcurrent) may occur when the diode circuit 10 is forward biased. Especially in operation scenarios in which at least one of the diodes $11_1$-$11_n$ is deactivated, there is the risk that the peak current overloads those diodes that are activated.

Figure 6:
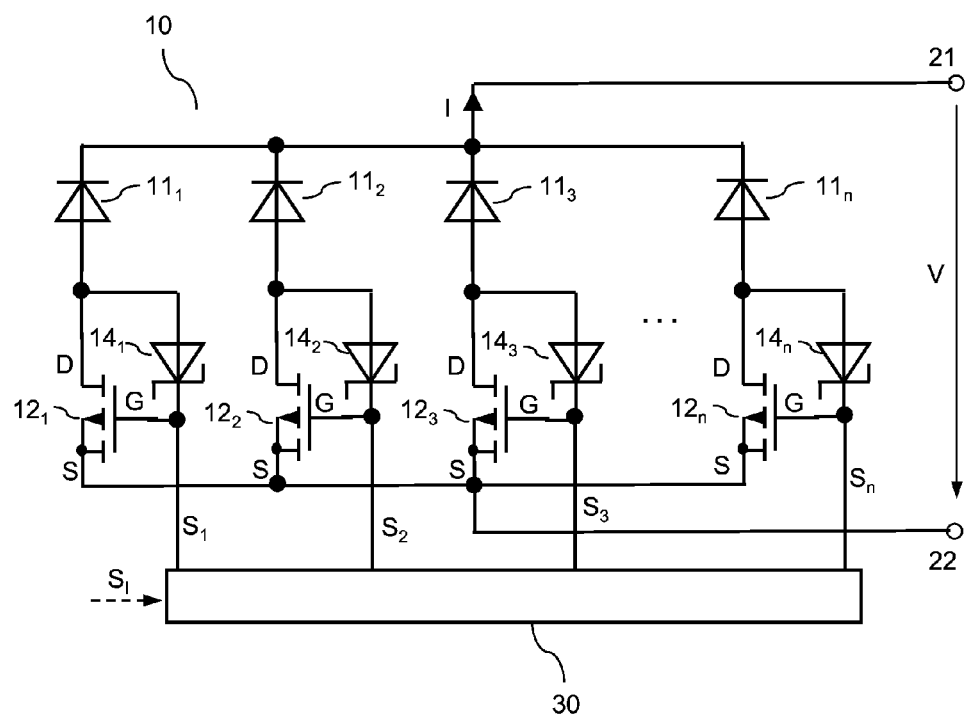
FIG. 6 illustrates a third embodiment of a diode circuit.

According to one embodiment, the diode circuit 10 includes protection means that activate at least some of the deactivated diodes in case of an overcurrent condition. An embodiment of a diode circuit 10 with overcurrent protection means is illustrated in FIG. 6. In this diode circuit 10, those of the switches $12_1$-$12_n$ that are switched off in order to deactivate the corresponding diode $11_1$-$11_n$ are switched on whenever the voltage V has a polarity that forward biases the diode circuit 10 and has a voltage level that is higher than a predefined voltage level. The predefined voltage level is such that voltage V reaches this voltage level only in case of an overcurrent scenario. In the embodiment of FIG. 6, the protection means includes Zener diodes $14_1$-$14_n$. Each of the Zener diodes $14_1$-$14_n$ is connected between the drain terminal D and the gate terminal G of one of the switches $12_1$-$12_n$. The switches $12_1$-$12_n$ are implemented as p-type (enhancement) MOSFETs in the embodiment of FIG. 6. Each of the Zener diodes $14_1$-$14_n$ is connected such that it switches on the corresponding MOSFET $12_1$-$12_n$ when a load-path voltage (drain-source voltage) of the MOSFET essentially reaches the breakdown voltage (Zener voltage) of the Zener diode $14_1$-$14_n$. The Zener diode $14_1$-$14_n$ switches on the MOSFET $11_1$-$11_n$ independent of the corresponding drive signal $S_1$-$S_n$. That is, the Zener diode overrides the drive signal $S_1$-$S_n$ when the voltage V reaches the predefined threshold. When the MOSFET $12_1$-$12_n$ of a diode that was deactivated switches on, the corresponding diode $11_1$-$11_n$ takes a share of the overall current, thereby reducing the current through those diodes that were activated before. The individual Zener diodes keep the MOSFETs of deactivated diodes conducting until the voltage V between the terminals 21, 22 falls below the predefined threshold.

The deactivation means (switches) $12_1$-$12_n$ and the diodes $11_1$-$11_n$ can be integrated in the same package or module. According to one embodiment, a switch and the corresponding diode are integrated in a chip-on-chip arrangement with a first semiconductor chip including the diode and a second semiconductor chip including the switch.

Figure 7:
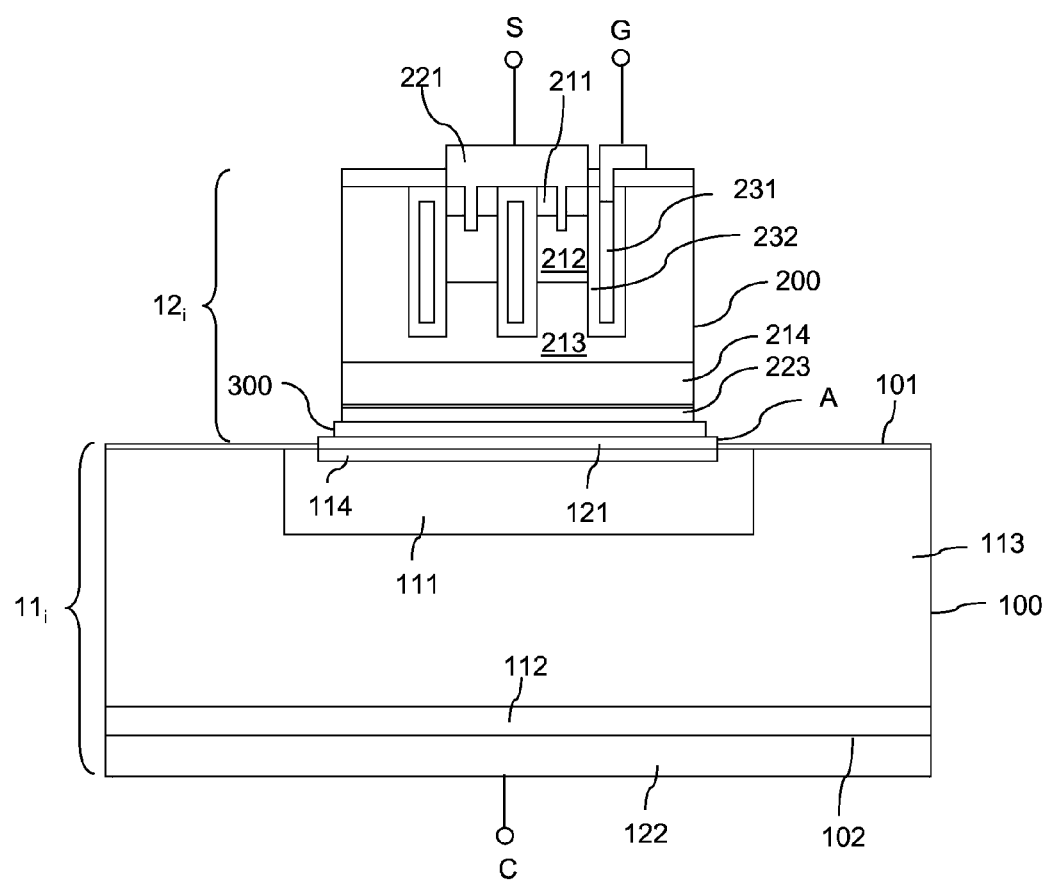
FIG. 7 illustrates an example of a chip-on-chip integration of a diode and a vertical p-MOS switch.

FIG. 7 illustrates one embodiment of such a chip-on-chip arrangement. In FIG. 7, reference character $11_i$ denotes the ith diode of the diodes $11_1$-$11_n$ as explained before, and reference character $12_i$ denotes the corresponding switch. Referring to FIG. 7, the ith diode $11_i$ is implemented as a vertical diode and includes a first semiconductor body 100 in which a first emitter region (anode region) 111 of a first conductivity type and a second emitter region (cathode region) 112 of the second conductivity type are arranged. The first and second emitter regions 111, 112 are spaced apart in a vertical direction of the first semiconductor body 100. A base region 113 of one of the first and second conductivity types and more lowly doped than the first and second emitter regions 111, 112 is arranged between the first and second emitter regions 111, 112. The first emitter region 111 is electrically connected to a first contact electrode 121 arranged on a first surface 101 of the first semiconductor body 100, and the second emitter region 112 is electrically connected to a second contact electrode 122 arranged on a second surface 102 opposite the first surface 101.

In the embodiment of FIG. 7, the MOSFET $12_i$ is implemented as a vertical MOSFET that includes at least one transistor cell in a second semiconductor body 200. The transistor cell includes a source region 211 electrically connected to a source (S) electrode 221, a body region 212 adjoining the source region 211 and a drift region 213. The body region 212 is located between the drift region 213 and the source region 211. The MOSFET further includes a drain region 214 that is electrically connected to a drain electrode 223, wherein the drift region 213 is arranged between the drain region 214 and the body region 212. The MOSFET further includes a gate electrode 231 adjacent the body region 212 and dielectrically insulated from the body region 212 by a gate dielectric 232. The gate electrode 231 includes several gate electrode sections, wherein each gate electrode section is adjacent the source and body regions 211, 212 of one transistor cell. Each of these gate electrode sections is electrically connected to the gate terminal G (although the connection between only one gate electrode section and the gate terminal G is visible in FIG. 7). The gate electrode 231 in a conventional manner serves to control a conducting channel in the body region 212 between the source region 211 and the drift region 213. The gate electrode 231 is electrically connected to a gate terminal G.

The MOSFET may include a plurality of transistor cells, wherein the individual transistor cells are connected in parallel by having their source region 211 electrically connected to a common source electrode 221. Further, the individual transistor cells share the drift region 213 and the drain region 214. The source electrode 221 is further connected to the body regions 212 of the individual transistor cells.

The MOSFET can be implemented as an n-type MOSFET or as a p-type MOSFET. In an n-type MOSFET, the source region 211, the drift region 213 and the drain region 214 are n-doped, while the body region 212 is p-doped. In a p-type MOSFET, the source region 211, the drift region 213 and the drain region 214 are p-doped, while the body region 212 is n-doped.

Referring to FIG. 7, the drain electrode 223 is electrically connected and mounted to the anode electrode 121 of the diode $11_i$. A connection layer 300, such as a solder layer, an electrically conducting glue layer, or the like, can be arranged between the anode electrode 121 and the drain electrode 223.

According to one embodiment, the MOSFET $12_i$ is a p-type MOSFET, the first emitter region 111 of the diode is p-doped, so as to form an anode region of the diode $11_i$, while the second emitter region 112 is n-doped, so as to form a cathode region. The base region 113 can either be n-doped or p-doped.

FIG. 7 shows one diode $11_i$ and the corresponding switch $12_i$. According to a further embodiment (not shown), several diodes are integrated in the semiconductor body 100. In this case, the individual diodes share the second emitter region 112 and the base region 113. The first emitter regions 111 of the individual diodes are spaced apart in a lateral direction of the semiconductor body 100. Optionally, vertical dielectric layers are arranged between the individual first emitter regions 111 of the individual diodes. On each of the first emitter regions 111 a MOSFET or another type of switch can be mounted in order to activate or deactivate the corresponding diode.

In the embodiments explained before, the circuit symbols of the individual diodes are circuit symbols of bipolar diodes (pin diodes). However, it is also possible, to implement the individual diodes as other types of diodes, such as Schottky diodes. A Schottky diode has a lower reverse recovery charge than a bipolar diode. It is even possible, to implement different types of diodes in one diode circuit 10. That is, at least one the diodes of the diode circuit 10 can be implemented as a Schottky diode, while at least another one of the diodes is implemented as a bipolar diode. In this embodiment, the Schottky diode may be connected such that it is always activated (does not include deactivation means). For example, the diode $11_1$ of FIG. 2 may be implemented as Schottky diode.

According to a further embodiment, at least one of the diodes $11_1$-$11_n$ of the diode circuit 10 is optimized to have a low reverse recovery charge stored in the diode in the forward biased mode. For example, a diode with a low reverse recovery charge can be obtained by implementing one of the emitter regions of the diode, such as emitter regions 111, 112 of FIG. 7, with a low emitter efficiency. In this embodiment, the diode with the low efficient emitter may be connected such that it is always activated (does not include deactivation means). For example, the diode $11_1$ of FIG. 2 may be implemented as a low efficient emitter diode.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for operating a circuit, the circuit comprising a first terminal and a second terminal and a plurality of diodes coupled in parallel between the first terminal and the second terminal, the method comprising in one drive cycle:
applying a first voltage between the first terminal and the second terminal for an on-time, the first voltage configured to forward bias the diodes;
applying a second voltage between the first terminal and the second terminal for an off-time after the on-time, the second voltage configured to reverse bias the diodes; and
switching a first group of the diodes into a deactivation state at a time instant before the end of the on-time, the first group of diodes comprising one or more but less than all of the diodes included in the circuit.

2. The method of claim 1, wherein the diodes of the first group are switched from an activation state to the deactivation state at a time instant before the end of the on-time.

3. The method of claim 1, wherein the diodes of the first group are in the deactivation state during the on-time.

4. The method of claim 1, wherein a selection of the first group of diodes is dependent on a load condition of the circuit.

5. The method of claim 4, wherein the load condition is dependent on a current through the circuit.

6. The method of claim 4,
wherein the circuit is operated in a plurality of subsequent drive cycles,
wherein the load condition is detected in one drive cycle, and
wherein the detected load condition is used to select the first group of diodes in a next drive cycle.

7. The method of claim 5, wherein the first group of diodes has an overall chip-size, and wherein the first group of diodes is selected such that the overall chip-size increases as the current through the circuit decreases.

8. The method of claim 1, further comprising:
deactivating a further group of the diodes during the on-time, the further group of diodes comprising one or more but less than all of the diodes included in the circuit.

9. The method of claim 8, wherein a selection of the further group of diodes is dependent on a load condition of the circuit.

10. The method of claim 9, wherein the load condition is dependent on a current through the circuit.

11. The method of claim 8,
wherein the circuit is operated in a plurality of subsequent drive cycles,
wherein the load condition is detected in one drive cycle, and
wherein the detected load condition is used to select the further group of diodes in a next drive cycle.

12. The method of claim 9, wherein the further group of diodes has an overall chip-size, and wherein the further group of diodes is selected such that the overall chip-size of the further group increases as the current through the circuit decreases.

13. The method of claim 1, wherein the diodes are selected from the group consisting of:
bipolar diodes;
Schottky diodes; and
low efficiency emitter diodes.

14. The method according to claim 1, wherein the time instant at which the first group of diodes is switched from the activation state to the deactivation state is between one to five times the carrier lifetime of the diodes before the end of the on-time.

15. A circuit, comprising:
a diode circuit comprising a first terminal, a second terminal, and a plurality of diodes coupled in parallel between the first terminal and the second terminal, the diode circuit configured to forward bias the plurality of diodes in an on-time and to reverse bias the plurality of diodes in an off-time; and
a deactivation circuit configured to switch a first group of the diodes from an activation state to a deactivation state at a time instant before the end of the on-time, the first group of diodes comprising one or more but less than all of the diodes included in the diode circuit.

16. The circuit of claim 15, wherein the deactivation circuit is configured to select the first group of diodes dependent on a load condition of the circuit.

17. The circuit of claim 16, wherein the load condition is dependent on a current through the circuit.

18. The circuit of claim 16,
wherein the diode circuit is configured to operate in a plurality of subsequent drive cycles,
wherein the deactivation circuit is configured to detect the load condition in one drive cycle and to use the detected load condition to select the first group of diodes in a next drive cycle.

19. The circuit of claim 17, wherein the first group of diodes has an overall chip-size, and wherein the deactivation circuit is configured to select the first group of diodes such that the overall chip-size increases as the current through the circuit decreases.

20. The circuit of claim 15, wherein the deactivation circuit is further configured to deactivate a further group of diodes during the on-time, the further group of diodes comprising one or more but less than all of the diodes included in the diode circuit.

21. The circuit of claim 20, wherein the deactivation circuit is configured to select the further group of diodes dependent on a load condition of the circuit.

22. The circuit of claim 15, wherein the deactivation circuit comprises:
at least one switch connected in series with at least one of the plurality of diodes; and
a drive circuit configured to switch on and switch off the at least one switch.

23. The circuit of claim 22, wherein the at least one switch comprises a MOS transistor.

24. The circuit of claim 23, wherein the MOS transistor comprises an internal diode connected back-to-back with the at least one diode connected in series with at least one switch.

25. The circuit of claim 23, wherein the at least one MOS transistor comprises protection means configured to activate the MOS transistor when a voltage across the MOS transistor exceeds a predefined voltage threshold.

26. The circuit of claim 25, wherein the protection means comprises a Zener diode coupled between a drain terminal and a gate terminal of the MOS transistor.

27. A method of operating a circuit comprising a first terminal, a second terminal and a plurality of diodes coupled in parallel between the first terminal and the second terminal, the method comprising in one drive cycle:
applying a first voltage between the first terminal and the second terminal for an on-time, the first voltage configured to forward bias the diodes;

applying a second voltage between the first terminal and the second terminal for an off-time after the on-time, the second voltage configured to reverse bias the diodes; and keeping in a deactivation state a first group of diodes during the on-time, the first group of diodes comprising one or more but less than all of the diodes included in the circuit.

* * * * *